United States Patent
Raith et al.

(10) Patent No.: US 11,894,181 B2
(45) Date of Patent: Feb. 6, 2024

(54) METHOD FOR DETERMINING THE OVERLOAD CAPACITY OF A HIGH-VOLTAGE DEVICE

(71) Applicant: Siemens Energy Global GmbH & Co. KG, Munich (DE)

(72) Inventors: Johannes Raith, Passail (AT); Ronny Fritsche, Nuremberg (DE); Thomas Hammer, Schwabach (DE); Matthias Kuestermann, Nuremberg (DE)

(73) Assignee: Siemens Energy Global GmbH & Co. KG, Munich (DE)

( * ) Notice: Subject to any disclaimer, the term of this patent is extended or adjusted under 35 U.S.C. 154(b) by 799 days.

(21) Appl. No.: 16/825,423

(22) Filed: Mar. 20, 2020

(65) Prior Publication Data
US 2020/0312538 A1   Oct. 1, 2020

(30) Foreign Application Priority Data
Mar. 28, 2019  (EP) .................................... 19165665

(51) Int. Cl.
*G01R 31/62*  (2020.01)
*H01F 27/40*  (2006.01)
(Continued)

(52) U.S. Cl.
CPC ............ *H01F 27/402* (2013.01); *G01K 1/20* (2013.01); *G01K 7/427* (2013.01); *H02J 3/003* (2020.01); *H01F 2027/406* (2013.01)

(58) Field of Classification Search
CPC .. H01F 27/402; H01F 2027/406; H02J 3/003; G01K 1/20; G01K 7/427; G01R 31/62
See application file for complete search history.

(56) References Cited

U.S. PATENT DOCUMENTS

| 2010/0188240 A1 | 7/2010 | Wells |
| 2016/0252401 A1 | 9/2016 | Feng et al. |
| 2019/0042954 A2 | 2/2019 | Li et al. |

FOREIGN PATENT DOCUMENTS

| CN | 106874534 A | 6/2017 |
| DE | 102007026175 B4 | 10/2009 |

(Continued)

OTHER PUBLICATIONS

Hazra et al., Optimal Utilization of Power Transformers Through Virtual Sensing, Oct. 6-9, 2013, 2013 4th IEEE PES Innovative Smart Grid Technologies Europe (ISGT Europe), Copenhagen, Denmark, 5 pp. (Year: 2013).*

(Continued)

*Primary Examiner* — Toan M Le
(74) *Attorney, Agent, or Firm* — Laurence A. Greenberg; Werner H. Stemer; Ralph E. Locher

(57) ABSTRACT

A method determines the overload capacity of a high-voltage device. The method includes creating a load forecast request for a predefined time period, determining an operational state of the high-voltage device by obtaining state parameters, transmitting the load forecast request and the state parameters at a request time to a load-forecasting model, and determining the maximum utilization in the predefined time period by the load-forecasting model, with which the overload capacity of a high-voltage device can be fully exploited. A lifetime consumption of the high-voltage device before the request time is derived from measured values by obtaining an actually consumed lifetime and the actually consumed lifetime is fed to the load-forecasting model as a state parameter. The load-forecasting model then determines the maximum overload capacity depending on the actually consumed lifetime.

14 Claims, 2 Drawing Sheets

(51) Int. Cl.
*H02J 3/00* (2006.01)
*G01K 1/20* (2006.01)
*G01K 7/42* (2006.01)

(56) References Cited

FOREIGN PATENT DOCUMENTS

| EP | 317571 B1 * | 11/1993 | ............... G01K 3/04 |
| WO | WO2015042793 A1 | 4/2015 | |

OTHER PUBLICATIONS

Tenbohlen et al., Experience-Based Evaluation of Economic Benefits of On-line Monitoring Systems for Power Transformers, CIGRE, Session 2002, 8 pp. (Year: 2002).*

* cited by examiner

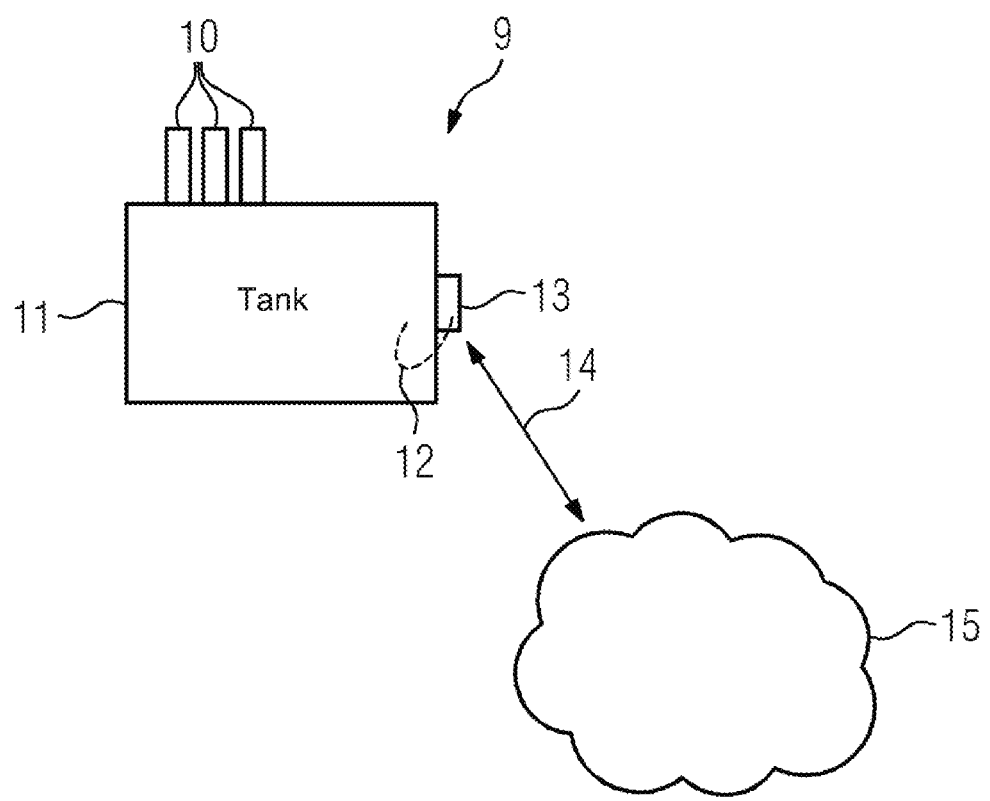

METHOD FOR DETERMINING THE OVERLOAD CAPACITY OF A HIGH-VOLTAGE DEVICE

CROSS-REFERENCE TO RELATED APPLICATION

This application claims the priority, under 35 U.S.C. § 119, of German application EP19165665, filed Mar. 28, 2019; the prior application is herewith incorporated by reference in its entirety.

BACKGROUND OF THE INVENTION

Field of the Invention

The invention relates to a method for determining the overload capacity of a high-voltage device in which a load forecast request is created for a predefined time period. An operational state of the high-voltage device is determined by obtaining state parameters. The load forecast request and the state parameters are transmitted at a request time to a load-forecasting model and the load-forecasting model determines the maximum utilization in the predefined time period.

A method of this type is known to the person skilled in the art from practice. Technical or economic requirements thus make it necessary from time to time to operate high-voltage devices such as transformers in overload. However, this is possible only to a certain extent without damaging the transformer. The overload capacity of transformers is conventionally represented in the form of "overload curves". Overload curves are created statically on the basis of the specification of the respective high-voltage device. The overload time period is defined in advance in static overload curves of this type and does not take account of a possibly higher overload potential for shorter time periods. A determination of the overload capacity using overload curves will be explained later in connection with FIG. 1.

A method for determining the aging rate of a transformer has become known from German patent DE 10 2007 026 175 B4. According to the previously known method, the aging rate $V_{IEC}$ of a transformer as a high-voltage device is calculated according to the IEC 60076-7 standard, wherein the oxygen content and moisture content of the insulating liquid of the transformer are taken into account.

The disadvantage of the aforementioned methods is that the operational state of the energy supply network is only inadequately determined, so that the potential of the high-voltage device to be operated with overload is only inadequately exploited.

BRIEF SUMMARY OF THE INVENTION

The object of the invention is therefore to provide a method of the aforementioned type by means of which the overload capacity of a high-voltage device can be fully exploited.

The invention achieves this object by deriving a lifetime of the high-voltage device consumed before the request time from measured values by obtaining an actually consumed lifetime and by feeding the actually consumed lifetime to the load-forecasting model as a state parameter, wherein the load-forecasting model determines the maximum overload capacity depending on the actually consumed lifetime.

According to the invention, the overload capacity is no longer determined on the basis of a roughly estimated overload profile. According to the invention, the remaining lifetime of the transformer is calculated and stored continuously or at specific time intervals. An appropriate storage unit which is connectable to the load-forecasting model at the request time is provided for this purpose. Whereas the capacities of the high-voltage device have not been fully exploited in the previously known methods, the invention enables the overload capacity of the respective high-voltage device to be determined more precisely and the potential of the transformer to be more or less fully exploited.

According to one related development, the state parameters comprise a parameter which maps the available cooling power. The cooling power is a particularly important quantity for calculating the overload capacity, since it significantly codetermines the temperature of the insulating liquid. With a high cooling power, the insulating fluid heats up less substantially and thus enables operation with a higher load. According to the invention, a dimensionless state parameter is suitable as a parameter. The present available cooling power is, for example, related to the nominal cooling power for this purpose. The nominal cooling power is indicated by the manufacturer.

The state parameters advantageously contain a parameter which maps the weather conditions to which the high-voltage device is exposed. A further significant influencing variable of the overload capacity and aging process of a transformer relates to the weather conditions which prevail at the location of the high-voltage device. The insulating fluid thus heats up, for example, at 35 degrees in the shade with strong solar radiation more quickly than at night at temperatures below freezing point. The database of a weather service, for example, can be accessed in order to obtain the weather conditions forecast for the request time.

According to a related development, the load forecast request can comprise a forecast of the weather conditions. According to this variant, the user of the method according to the invention can himself refer to a weather service in order to find out the weather conditions and then incorporate them into his request.

The consumed lifetime of the high-voltage device can be continuously determined and stored in a storage unit.

The load forecast request appropriately comprises an indication of the desired lifetime consumption. This variant enables the user to incorporate a condition into his request. This condition relates to the desired lifetime consumption. This is important, for example, if the high-voltage device is already older and has only a short remaining lifetime. The user then normally attempts to minimize the lifetime consumption in order to avoid an early replacement of the old high-voltage device with a new device.

In a further variant of the invention, measured values are captured by sensors which are disposed in or on the high-voltage device, wherein the state parameters are obtained at least partially on the basis of the measured values and/or the values derived therefrom. The operational state of a high-voltage device can be precisely determined on the basis of measurements. Measured values of this type and/or values derived therefrom comprise, for example, the temperature of an insulating fluid in the upper and lower area of a tank of the power transformer and the winding currents, i.e. the electric currents, which flow over the low-voltage and/or high-voltage winding.

Measured values and/or values derived from the measured values which have been captured or derived before the request time are appropriately used. Dynamic effects can be taken into account and can be made visible using measured values or derived values from the past. If, for example, the temperature of an insulating liquid of a transformer as a high-voltage device does not increase continuously, but instead abruptly, e.g. from one minute to the next, this is a clear indication of a fault which should be cleared as soon as possible. Abrupt changes of this type should, however, be excluded in the modeling of the overload capacity.

The sensors disposed on or in the respective high-voltage device are advantageously connected via a short-range area communication connection to a communication unit. The short-range communication connection may, for example, be a simple cable. Alternatively, the short-range communication connection is, for example, a ZigBee, Bluetooth, wireless, Ambus or WiFi communication connection. The short-range communication connection extends over a maximum of 100 meters.

The communication unit preferably has at least one analog and at least one digital input. A plurality of sensors can thus be connected to one communication unit. The communication unit has, for example, a main processor and a secondary processor, as well as a storage unit in which preprocessed measured values or values derived therefrom can be stored and processed, e.g. through averaging. The measured values of different sensors can therefore be transmitted jointly from a communication unit e.g. via a long-range communication connection to a data processing cloud.

According to the invention, the sensors are essentially designed in any desired manner. At least one temperature sensor is advantageously provided to measure the temperature of the insulating fluid and at least one current sensor to measure the winding current of the high-voltage or low-voltage winding.

A data processing cloud is intended to be understood here to mean an arrangement having one or more data storage devices and one or more data processing devices which can be designed through suitable programming to perform any given data processing operations. The data processing devices normally represent universal data processing devices here, such as, for example, servers which initially have no specific design whatsoever in terms of their construction and programming. The universal data processing device is not capable of performing specific functions until it has been programmed.

If the data processing cloud has a plurality of individual components, the components are interconnected in a suitable manner for data communication, for example by means of a communication network. Any given data can be fed to a data processing cloud for data storage and/or processing. The data processing cloud in turn makes the stored data and/or the events of the performed data processing available to other devices, for example computer workstations, laptops, smartphones connected to a data processing cloud. A data processing cloud can be provided, for example, by a datacenter or a plurality of networked datacenters. A data processing cloud is normally spatially distanced from the high-voltage devices.

The connection between the communication unit and the data processing cloud is established via a long-range communication connection. In order to set this up, the communication unit has a long-range communication device, such as, for example, a mobile radio communication module according to the GPRS or UMTS standard. A long-range communication connection, preferably an IP-based data connection, to the data processing cloud is set up with said module. A provider of a mobile radio communication service, for example, or a telecommunications provider can be interposed and the long-range communication connection can be set up at least partially via a communication network of this provider and/or at least partially via the Internet. Only a very low configuration or parameterization cost is then incurred in setting up the connection. Apart from the configuration of the long-range communication device with the information required to set up the long-range communication connection, e.g. the installation of a SIM card of a telecommunication provider, no further cost needs to be incurred for the individual communication unit.

According to the invention, a user can log in to the data processing cloud using access data or, in other words, login data. The data processing cloud recognizes which high-voltage devices or which communication units are relevant to the user on the basis of the user data. To do this, the data processing cloud has an appropriate database which is stored on a storage device of the data processing cloud. If the user is, for example, an operator of a specific area or of an energy supply network, the data processing cloud recognizes, for example, that the user is operating ten transformers. Each of these high-voltage devices has sensors which are connected to at least one communication unit. According to the invention, the data processing cloud communicates with these communication units only, which are also referred to below as selected communication units.

The data processing cloud appropriately has a database by which the high-voltage device which is assigned to the respective user of the data processing cloud can be determined. Further data which enable a connection between the data processing cloud and the selected communication units are stored in the table.

A high-voltage device according to the invention is configured for operation in the high-voltage network, i.e. for an operating voltage between 1 kV and 1000 kV, in particular 50 kV and 800 kV. The high-voltage network is preferably an AC voltage network. However, a DC voltage network and/or a combination of an AC and DC voltage network are/is also possible according to the invention.

According to the invention, a high-voltage device is, for example, a transformer, in particular a power transformer, a high-voltage bushing or the like.

At least one storage unit is necessary in order to be able to provide the measured values and/or values derived therefrom occurring before the request time. According to one development of the invention, this storage unit is, for example, provided in the communication unit. According to this variant of the invention, it is not necessary to maintain a long-range communication connection continuously between the communication unit and the data processing cloud. According to this development, the measured values or values derived therefrom can be stored locally. The locally stored values are then transmitted during the next connection to the data processing cloud.

In a further variant of the invention, measured values and/or values derived therefrom captured before the request time are stored on a storage device of the data processing cloud. According to this advantageous development, either only the data processing cloud or the data processing cloud in addition to the communication units has a storage unit. This central storage unit serves to store the measured values and/or values derived therefrom e.g. after a long-range communication connection has been set up by the user at the request time between the communication unit and the data processing cloud. Alternatively, the data processing cloud can be connected to each communication unit at fixed intervals in order to access locally stored data in order to store the data on the larger central storage unit. An overflow of the local memories of the communication units is thus avoided.

According to a further variant of the invention, a long-range communication connection exists continuously between the communication units and the data processing cloud so that the measured values and/or values derived therefrom are transmitted continuously to this storage unit of the data processing cloud and are stored there in order to be able to be presented at the request time with other data, values or information in a time-resolved manner.

Access data are, for example, normal login data here. The access data thus consist, for example, of a username and a password which is assigned individually to the username.

The geographical location of the respective communication unit and the high-voltage device connected to it are advantageously determined by means of an antenna for position determination which is disposed in the communication unit, and the weather conditions are determined by a weather-reporting service on the basis of the geographical data. According to this advantageous development, the weather conditions do not have to be recorded in a costly manner in situ. According to the invention, data which already exist, e.g. on the Internet, can be used instead. The data relating to the weather conditions obtained in this way can similarly be taken into account in calculating the actual lifetime.

According to one advantageous development, the data processing cloud has a storage unit on which measured values and/or values derived from the measured values are stored, the values being transmitted by the communication units via a long-range communication connection. As already mentioned above, the long-range communication connection can be continuous or, in other words, permanent. Alternatively, however, it is also possible according to the invention to set up the long-range communication connection at specific intervals in order to transmit data blocks consisting of measured values which have been captured between request intervals and have been locally stored.

Each communication unit is advantageously equipped with an antenna for position determination.

Other features which are considered as characteristic for the invention are set forth in the appended claims.

Although the invention is illustrated and described herein as embodied in a method for determining the overload capacity of a high-voltage device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 3 is an illustration of a transformer with a communication unit and a data processing cloud.

DETAILED DESCRIPTION OF THE INVENTION

Figure 1:
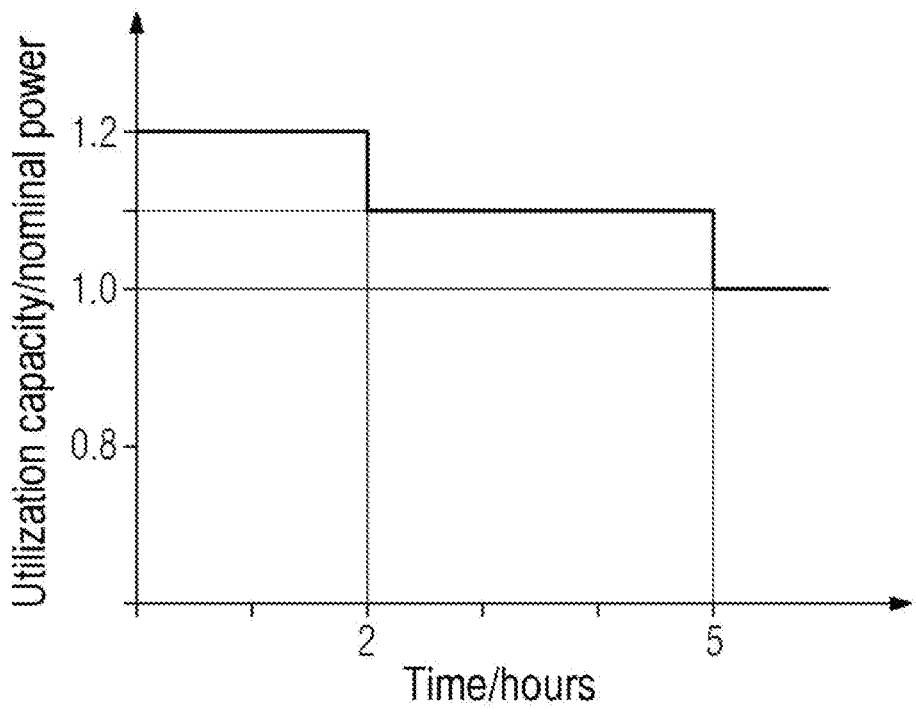
FIG. 1 is a graph showing an overload curve of a transformer according to the prior art.

Referring now to the figures of the drawings in detail and first, particularly to FIG. 1 thereof, there is shown an example embodiment of an overload curve, already introduced above, of a transformer, wherein a time in hours is plotted on the x-axis and a utilization capacity of the transformer in relation to a nominal power is plotted on the y-axis. The overload curve shown was created following the manufacture of the transformer assigned to it on the basis of test measurements on said transformer and was made available to the customer.

In the example embodiment shown in FIG. 1, the transformer can be operated for 2 hours with an overload of 120% in relation to the nominal power (100%). Operation with an overload of 110% is then possible for 3 hours.

It is assumed that the overload operation takes place constantly in each case, i.e. 2 hours with 120% of the nominal power and 3 hours with 110% of the power. However, this is not the case in reality. Instead, the transformer is not operated continuously with 120% overload during the 2 hours. Fluctuations instead occur in the 2 hours. Operation is thus possible, for example, for 20 minutes at nominal power, for 10 minutes at 80% of the nominal power, for 30 minutes at 70% of the nominal power and for 60 minutes with an overload of 120% of the nominal power. This different loading obviously impacts on the lifetime or aging of the transformer. In other words, the potential of the transformer is not fully exploited.

Transformers are key components of electrical supply networks. The failure of a transformer can result in extreme losses and even network outages. Transformers are therefore carefully monitored. In order to establish the aging of a transformer, a temperature curve, for example, of the transformer is recorded in order to thus obtain information relating to the present load and lifetime.

It is known from the ICE 60076-7 standard for an aging rate of an electrical transformer to be calculated depending on the hotspot temperature. Particularly the insulating paper of the windings is taken into account in the calculation. It is assumed by way of approximation that the insulating properties of the insulating paper are dependent on the degree of polymerization of the insulating paper, along with other influencing variables. However, the loads occurring during the operation of the transformer modify the degree of polarization of the insulating paper in such a way that the insulation capability of the winding paper decreases as the lifetime increases and finally becomes insufficient, so that the transformer reaches the end of its lifetime.

The hotspot temperature can be determined from measurements of the temperature of the insulating fluid and from the measurement of the winding current. As already explained above, the lifetime of the transformer can be determined from the hotspot temperature.

The invention is based on the idea that the oil temperature and the winding current are in any case continuously observed. With regard to digitization, it is additionally probable that these measurement variables or data derived therefrom are transmitted from the respective high-voltage device to a data processing cloud, wherein the data processing cloud continuously determines the lifetime of the transformer from the data made available to it and can make this variable available, for example to a load-forecasting model.

Figure 2:
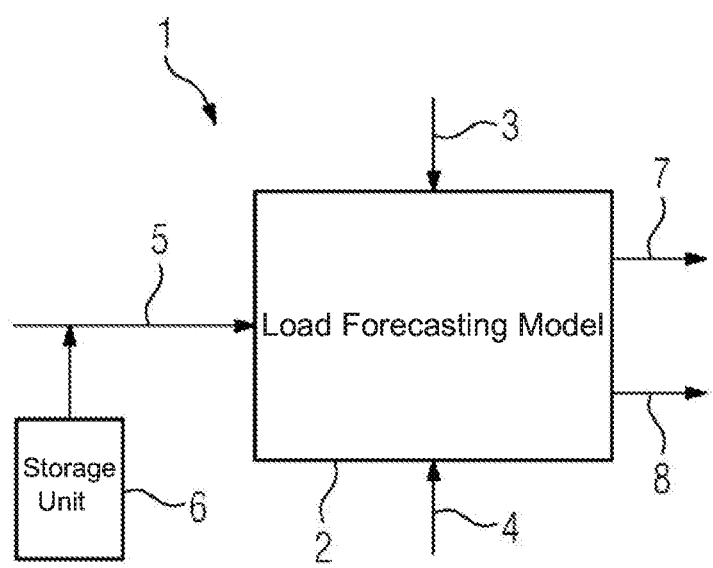
FIG. 2 is a block diagram of an example embodiment of the method according to the invention.

FIG. 2 shows an example embodiment of the method 1 according to the invention which is shown schematically in FIG. 2. A load-forecasting model 2 is shown which receives a load forecast request 3 at a request time. The load forecast request 3 contains the query concerning the amount of overload with which the transformer can be operated in 2 hours for 8 hours if the lifetime consumption is intended to be 110%. Reference is made to the lifetime consumption (100%) which occurs during an operation of the transformer at nominal power.

In addition, state parameters 4 are transmitted to the load-forecasting model 2, wherein, in the example embodiment shown, the state parameters 4 contain the temperature of the insulating fluid in the upper area of the transformer and the winding current. Further state parameters relate to the available cooling power and the forecast weather conditions at the location of the transformer. In addition, the hitherto consumed lifetime 5 is fed to the load-forecasting model 2 as a state parameter.

According to the invention, the already consumed lifetime is in no way roughly estimated. Instead, the consumed lifetime is determined continuously on the basis of measured values and is stored on a storage unit 6. According to the invention, it is possible for the load-forecasting model 2 to determine the overload capacity of the transformer more precisely on the basis of the lifetime measured in this way or, in other words, the lifetime consumption measured in this way.

On the output side, the load-forecasting model generates, on the one hand, the statement 7 indicating the level of the maximum possible overload operation in the desired time period. The load-forecasting model furthermore indicates the expected lifetime consumption 8 in the desired time period.

FIG. 3 shows a schematically illustrated transformer 9 with its three bushings 10 which are supported on a tank of the transformer 11. On their end facing away from the tank 11, the bushings 10 have an outdoor connection to connect an air-insulated high-voltage line of an energy supply network. Each bushing 10 has an inner high-voltage conductor which extends through a hollow insulator. The insulator and the high-voltage conductor pass through the upper wall of the tank of the transformer and extend with their free end into the oil chamber of the tank 11. The high-voltage conductor of each bushing 10 can thus be connected to the respective high-voltage winding of the transformer. Each high-voltage winding is disposed concentrically with a low-voltage winding through which a leg of a magnetizable core extends. The high-voltage and low-voltage windings are thus inductively coupled with one another.

The tank of the transformer is filled with an insulating fluid which serves to insulate and cool the high-voltage-connected windings and the core. The transformer further has a cooling unit, but this is not shown in the figure.

The transformer 9 is equipped with temperature sensors which are disposed inside the tank 11 to measure the temperature of the insulating fluid and are therefore not shown in the figure. Each temperature sensor is connected via a short-range communication connection 12 to a communication unit 13 attached to the transformer 9, wherein the short-range communication connection 12 is designed in this case as a cable. The communication unit 13 is in turn connected via a long-range communication connection 14 to a data processing cloud 15.

The temperature measured values captured by the temperature sensors are transmitted via the short-range communication connection 12 to the communication unit 13. The communication unit transmits the temperature measured values via the long-range communication connection 14 to the data processing cloud 15. The data processing cloud 15 has the storage device 6 shown in FIG. 2 and calculates the consumed lifetime on the basis of the captured temperature measured values and the captured winding currents according to the aforementioned standard. The lifetime consumption of the transformer 9 is determined continuously in this way and is available on demand to the load-forecasting model 2 according to FIG. 2.

The invention claimed is:

1. A method for determining an overload capacity of a high-voltage device, which comprises the steps of:
    creating a load forecast request for a predefined time period;
    determining an operational state of the high-voltage device by obtaining state parameters;
    transmitting the load forecast request and the state parameters at a request time to a load-forecasting model;
    deriving a lifetime consumption of the high-voltage device, before the request time, from measured values by obtaining an actually consumed lifetime of the high-voltage device and by feeding the actually consumed lifetime to the load-forecasting model as a state parameter, wherein the load-forecasting model determines a maximum overload capacity depending on the actually consumed lifetime; and
    determining, via the load-forecasting model, a maximum utilization in the predefined time period.

2. The method according to claim 1, wherein the state parameters include a parameter which maps available cooling power.

3. The method according to claim 1, wherein the state parameters contain a parameter which maps weather conditions to which the high-voltage device is exposed.

4. The method according to claim 1, which further comprises continuously calculating the actually consumed lifetime of the high-voltage device and storing the actually consumed lifetime in a storage unit.

5. The method according to claim 1, wherein the load forecast request contains a forecast of weather conditions.

6. The method according to claim 1, wherein the load forecast request includes an indication of a desired lifetime consumption.

7. The method according to claim 1, wherein the load-forecasting model indicates an expected lifetime consumption.

8. The method according to claim 1, which further comprises:
    capturing the measured values using sensors which are disposed in or on the high-voltage device; and
    obtaining operational state parameters at least partially on a basis of the measured values and/or values derived therefrom.

9. The method according to claim 8, which further comprises transmitting the measured values and/or the values derived therefrom via a short-range communication connection from the sensors to a communication unit of the high-voltage device, wherein the communication unit is connectable via a long-range communication connection to a data processing cloud.

10. The method according to claim 9, which further comprises storing the measured values and/or the values derived therefrom captured before the request time on a storage device of the communication unit or of the data processing cloud.

11. The method according to claim 9, wherein a geographical location of the communication unit and the high-voltage device connected to it are determined by an antenna for position determination which is disposed in the communication unit, and weather data are then captured by a weather-reporting service, the weather data being provided by a service provider for the geographical location of the high-voltage device.

12. The method according to claim 1, which further comprises deriving the measured values and/or values derived from the measured values which have been captured or derived before the request time.

13. A non-transitory storage medium carrying computer executable instructions for performing a method for determining an overload capacity of a high-voltage device, the method comprises the steps of:
- creating a load forecast request for a predefined time period;
- determining an operational state of the high-voltage device by obtaining state parameters;
- transmitting the load forecast request and the state parameters at a request time to a load-forecasting model;
- deriving a lifetime consumption of the high-voltage device before the request time from measured values by obtaining an actually consumed lifetime of the high-voltage device and by feeding the actually consumed lifetime to the load-forecasting model as a state parameter, wherein the load-forecasting model determines a maximum overload capacity depending on the actually consumed lifetime; and
- determining, via the load-forecasting model, a maximum utilization in the predefined time period.

14. A non-transitory storage medium carrying computer executable instructions for performing a method for determining an overload capacity of a high-voltage device, the method comprises the steps of:
- creating a load forecast request for a predefined time period;
- determining an operational state of the high-voltage device by obtaining state parameters;
- transmitting the load forecast request and the state parameters at a request time to a load-forecasting model;
- deriving a lifetime consumption of the high-voltage device before the request time from measured values by obtaining an actually consumed lifetime of the high-voltage device and by feeding the actually consumed lifetime to the load-forecasting model as a state parameter, wherein the load-forecasting model determines a maximum overload capacity depending on the actually consumed lifetime;
- capturing the measured values using sensors which are disposed in or on the high-voltage device;
- obtaining operational state parameters at least partially on a basis of the measured values and/or values derived therefrom;
- transmitting the measured values and/or the values derived therefrom via a short-range communication connection from the sensors to a communication unit of the high-voltage device, wherein the communication unit is connectable via a long-range communication connection to a data processing cloud; and
- determining, via the load-forecasting model, a maximum utilization in the predefined time period.

* * * * *